(12) United States Patent
Chiang et al.

(10) Patent No.: US 6,967,845 B2
(45) Date of Patent: Nov. 22, 2005

(54) INTEGRATED HEAT DISSIPATING DEVICE WITH CURVED FINS

(75) Inventors: Tsai Liang Chiang, Wugu (TW); Takashi Wu, Wugu (TW)

(73) Assignee: Cpumate Inc., Taipei (TW)

( * ) Notice: Subject to any disclaimer, the term of this patent is extended or adjusted under 35 U.S.C. 154(b) by 183 days.

(21) Appl. No.: 10/700,593

(22) Filed: Nov. 5, 2003

(65) Prior Publication Data

US 2005/0094375 A1    May 5, 2005

(51) Int. Cl.[7] ............................................. H05K 7/20
(52) U.S. Cl. .................. 361/709; 361/696; 361/702; 361/703; 361/697; 361/710; 257/722; 257/706; 257/720; 165/80.3
(58) Field of Search ................................ 361/701–705, 361/706–712, 717–719, 722, 727, 688, 695–697; 257/705, 706, 707, 713, 717–719, 720–722; 439/68, 487; 248/510; 174/16.3; 165/80.3, 165/185; 24/458

(56) References Cited

U.S. PATENT DOCUMENTS

| | | | | |
|---|---|---|---|---|
| 4,291,754 A | * | 9/1981 | Morse et al. ................ 165/165 |
| 5,020,586 A | * | 6/1991 | Mansingh ................... 165/80.3 |
| 5,699,853 A | * | 12/1997 | Goth et al. ............. 165/104.21 |
| 5,912,802 A | * | 6/1999 | Nelson ......................... 361/695 |
| 5,946,190 A | * | 8/1999 | Patel et al. ................. 361/700 |
| 5,959,837 A | * | 9/1999 | Yu ............................... 361/697 |
| 6,062,301 A | * | 5/2000 | Lu .............................. 165/80.3 |
| 6,076,594 A | * | 6/2000 | Kuo ........................... 165/80.3 |
| 6,189,601 B1 | * | 2/2001 | Goodman et al. ......... 165/80.3 |
| 6,289,975 B2 | * | 9/2001 | Kuo ........................... 165/80.3 |
| 6,352,104 B1 | * | 3/2002 | Mok .......................... 165/80.3 |
| 6,404,632 B1 | * | 6/2002 | Forkas ........................ 361/703 |
| 6,625,021 B1 | * | 9/2003 | Lofland et al. ............. 361/697 |
| 6,651,734 B1 | * | 11/2003 | Liu ............................ 165/80.3 |
| 6,680,015 B2 | * | 1/2004 | McCullough ............... 264/105 |
| 6,758,263 B2 | * | 7/2004 | Krassowski et al. ........ 165/185 |
| 6,782,941 B2 | * | 8/2004 | Lee ........................... 165/80.3 |
| 6,827,136 B2 | * | 12/2004 | Liu ....................... 165/104.33 |
| 6,842,342 B1 | * | 1/2005 | Lin ............................. 361/710 |
| 6,880,346 B1 | * | 4/2005 | Tseng et al. ................. 62/3.7 |
| 6,883,592 B2 | * | 4/2005 | Lee ............................ 165/80.3 |
| 2005/0061480 A1 | * | 3/2005 | Carter et al. ............... 165/80.3 |
| 2005/0073811 A1 | * | 4/2005 | Wang et al. ................ 361/688 |
| 2005/0092465 A1 | * | 5/2005 | Lin et al. ............... 165/104.21 |

FOREIGN PATENT DOCUMENTS

EP         1045303 A1 * 10/2000    ............. G06F 1/20

* cited by examiner

Primary Examiner—Anatoly Vortman (57) ABSTRACT

An integrated heat dissipating device has a heat sink, a first set of fins, a second set of fins and at least one heat pipe. The heat sink has a thermal conductive block embedded therein and a through hole exposing the thermal conductive block from a top surface of the heat sink. The first set of fins has a plurality of horizontally extending fins stacked with each other along a vertical direction over the heat sink. The second set of fins is integrated by a plurality of vertically extending fins arranged in a curved shape between the heat sink and the first set of fins. The heat pipe has a vertical extension across the first set of fins and a horizontal extension underneath a bottom of the first set of fins. The horizontal extension is inserted into the through hole in contact with the thermal conductive block.

16 Claims, 10 Drawing Sheets

INTEGRATED HEAT DISSIPATING DEVICE WITH CURVED FINS

BACKGROUND OF THE INVENTION

The present invention relates to an integrated heat dissipating device with curved fins, and more particular, to a heat dissipating device having a heat pipe to increase the heat dissipation area and heat conduction performance, so as to enhance the heat dissipation efficiency.

Figure 1:
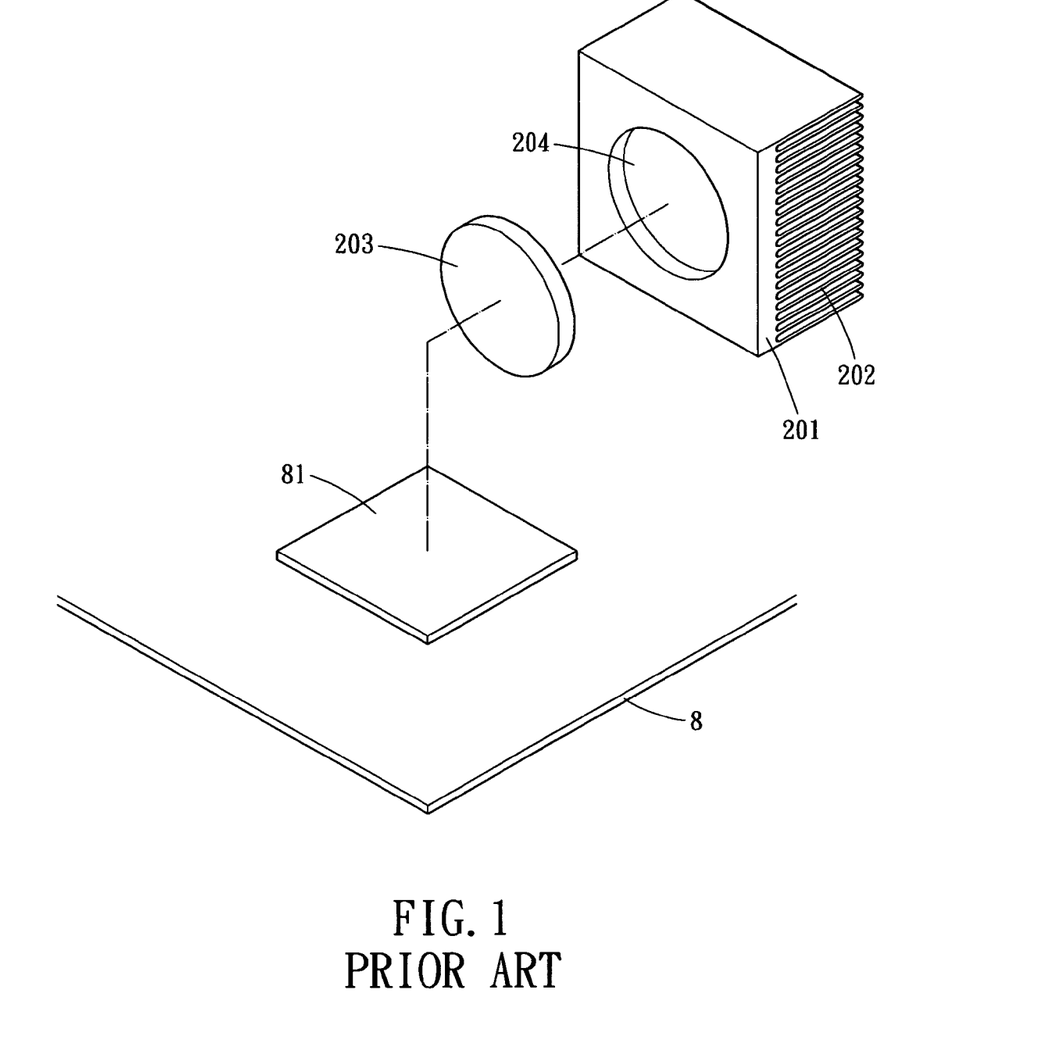
FIG. 1 shows an exploded view of a conventional heat dissipating device.

FIG. 1 shows a conventional heat dissipation device 20 applied to a central processing unit (CPU) of a computer. The heat dissipation device 20 includes an aluminum extruded heat sink 201, a plurality of fins 202 integrated with the heat sink 201, and a fan attached to the fins 202. To enhance the heat dissipation performance of the heat dissipation device 20, a thermal conductive block 20 is embedded in the bottom of the heat sink 201. The thermal conductive block 203 is fabricated from good thermal conductive material such as copper. A receiving slot 204 is formed on the bottom of the heat sink 201, such that the thermal conductive block 203 can be accommodated in the receiving slot 204. Thereby, the heat dissipation device 20 can be mounted on a central processing unit 81 of a printed circuit board (PCB) 8. Via the thermal conductive block 203, heat generated by the central processing unit 81 is delivered to the fins 202. Further via the fan, the heat can be effectively dissipated.

However, though the above heat dissipation device 20 incorporates the thermal conductive block 203 to deliver the heat, heat will be accumulated in the heat sink 202 because the thermal conductive block 203 is located at the bottom of the heat dissipation device 20 and the top portions of the fins 202 are spaced from each other by a relative large distance.

BRIEF SUMMARY OF THE INVENTION

The present invention provides an integrated heat dissipating device having curved fins which incorporates a heat pipe to enhance thermal conduction efficiency. The curved fins increase heat dissipation area. Further, by arranging the heat pipe perpendicular to the wind blowing direction of the fan, the heat dissipation effect of the heat pipe is enhanced to improve the heat dissipation efficiency and thermal conduction of the heat dissipation device.

The heat dissipating device provided by the present invention comprises a heat sink, a first set of fins, a second set of fins and at least one heat pipe. The heat sink has a thermal conductive block embedded therein and a through hole exposing the thermal conductive block from a top surface of the heat sink. The first set of fins includes a plurality of horizontally extending fins stacked with each other along a vertical direction over the heat sink. The second set of fins is integrated by a plurality of vertically extending fins arranged in a curved shape between the heat sink and the first set of fins. The heat pipe comprises a vertical extension across the first set of fins and a horizontal extension underneath a bottom of the first set of fins. The horizontal extension is inserted into the through hole in contact with the thermal conductive block.

Preferably, the heat sink includes a planar structure with a bottom surface partially recessed to form a receiving slot aligned with the through hole for embedding the thermal conductive block. The thermal conductive block has a thermal conducting coefficient larger than that of the heat sink. The heat pipe has an L shape, and may further comprise a bending portion interconnecting the vertical extension and the horizontal extension.

In one embodiment of the present invention, the device further comprises a third set of fins mounted between the heat sink and the first set of vertically extending fins. The second and third sets of fins are disposed at two opposing sides of the through hole.

The device may further comprise a fan mounted to a first side surface of the heat dissipating device, and a wind mask fitting over the first, second and third sets of fins for mounting the fan to the first side surface. The wind mask covers a top surface and two opposing surfaces perpendicular to the first side surface of the heat dissipating device.

The present invention further provides a heat dissipating device comprising a heat sink, a first set of fins, a second set of fins, a third set of fins and at least one heat pipe. The heat sink has a thermal conductive block embedded therein and a through hole exposing the thermal conductive block from a top surface of the heat sink. The first set of fins stacked with each other along a vertical direction over the heat sink. The second set of fins is integrated by a plurality of vertically extending fins disposed between the heat sink and the first set of fins at a first side of the through hole. The third set of fins is integrated by a plurality of vertically extending fins disposed between the heat sink and the first set of fins at a second side of the through hole. The second and third sets are disposed on the heat sink at two opposing sides of the through hole. The heat pipe comprises a vertical extension across the first set of fins and a horizontal extension underneath a bottom of the first set of fins, and the horizontal extension is inserted into the through hole in contact with the thermal conductive block.

Preferably, the second set of fins has a curved shape. The device may further comprise a fan operative to generate wind along a direction parallel to each fin of the first set of fins, and a wind mask covering two side surfaces of the heat dissipating device parallel to the wind direction.

BRIEF DESCRIPTION OF THE DRAWINGS

These, as well as other features of the present invention, will become apparent upon reference to the drawings wherein.

DETAILED DESCRIPTION OF THE INVENTION

Figure 2:
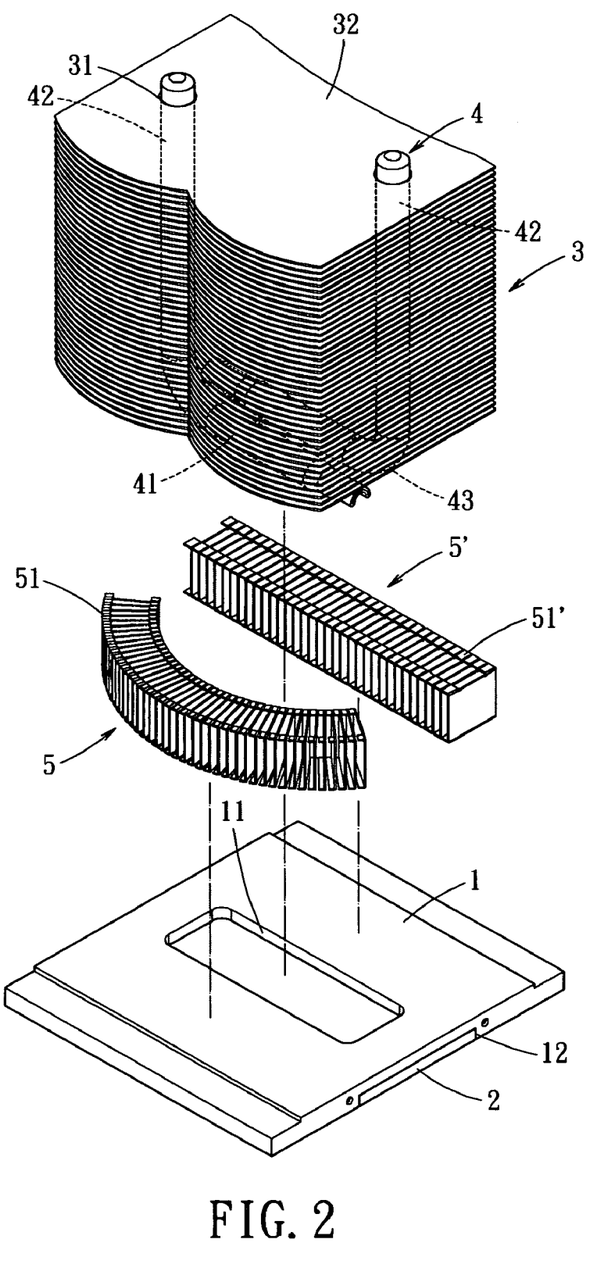
FIG. 2 shows an exploded view of a heat dissipating device provided by the present invention.
Figure 3:
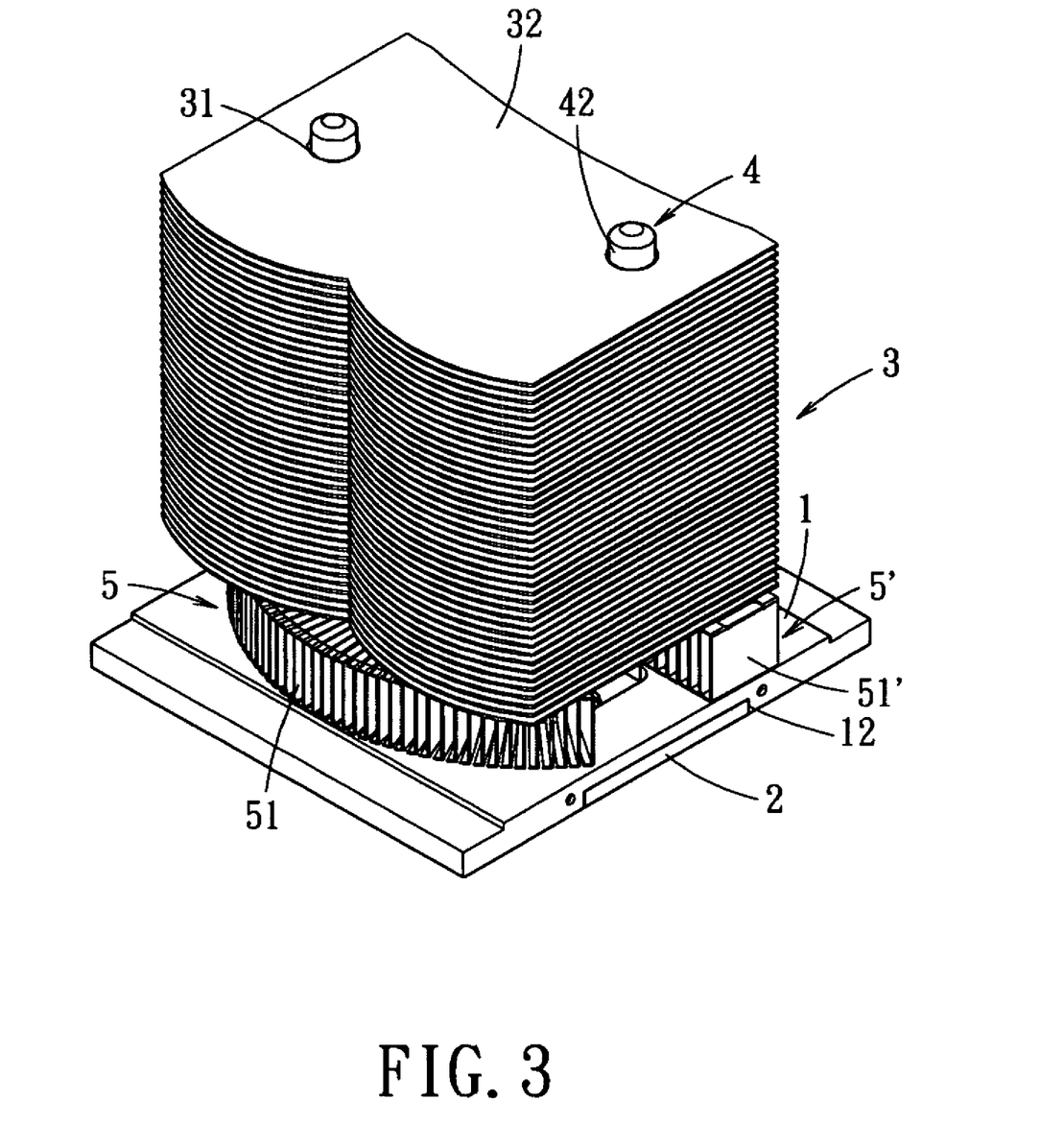
FIG. 3 shows a perspective view of the heat dissipating device as shown in FIG. 2.

FIGS. 1 and 2 depict an exploded view and a perspective view of an integrated heat dissipating device provided by the present invention. As shown, the heat dissipating device 10 is applied to a central processing unit and includes a heat sink 1, a firs set of fins 3, a second set of fins 5 and a heat pipe 4.

The heat sink 1 has a planar configuration and is preferably made of good thermal conductive material such as aluminum. A through hole or opening 10 is formed in the heat sink 1, while a part of the bottom surface of the heat sink 1 is recessed to form a receiving slot 12 which is aligned under the opening 11. A thermal conductive block 2 is embedded in the heat sink 1 at the receiving slot 12. Preferably, the thermal conductive block 2 is fabricated from material with thermal conductivity better than that of the heat sink 1. Therefore, when the heat sink 1 is fabricated from aluminum, the thermal conductive block 2 can be formed of copper, for example. Thereby, when heat dissipating device 10 is applied to a central processing unit by attaching the heat sink 1 on the central processing unit, a direct contact between the central processing unit and the thermal conductive block 2 is obtained.

The first set of fins 3 includes a plurality of planar fins 32 stacked with each other along a vertical direction. In other words, the first set of fins 3 including a plurality of horizontally extending fins 32. The neighboring fins 32 may be adjacent to each other or spaced with each other by a predetermined space. Preferably, the fins 32 are formed of thermal conductive material such as copper, for example.

Figure 4:
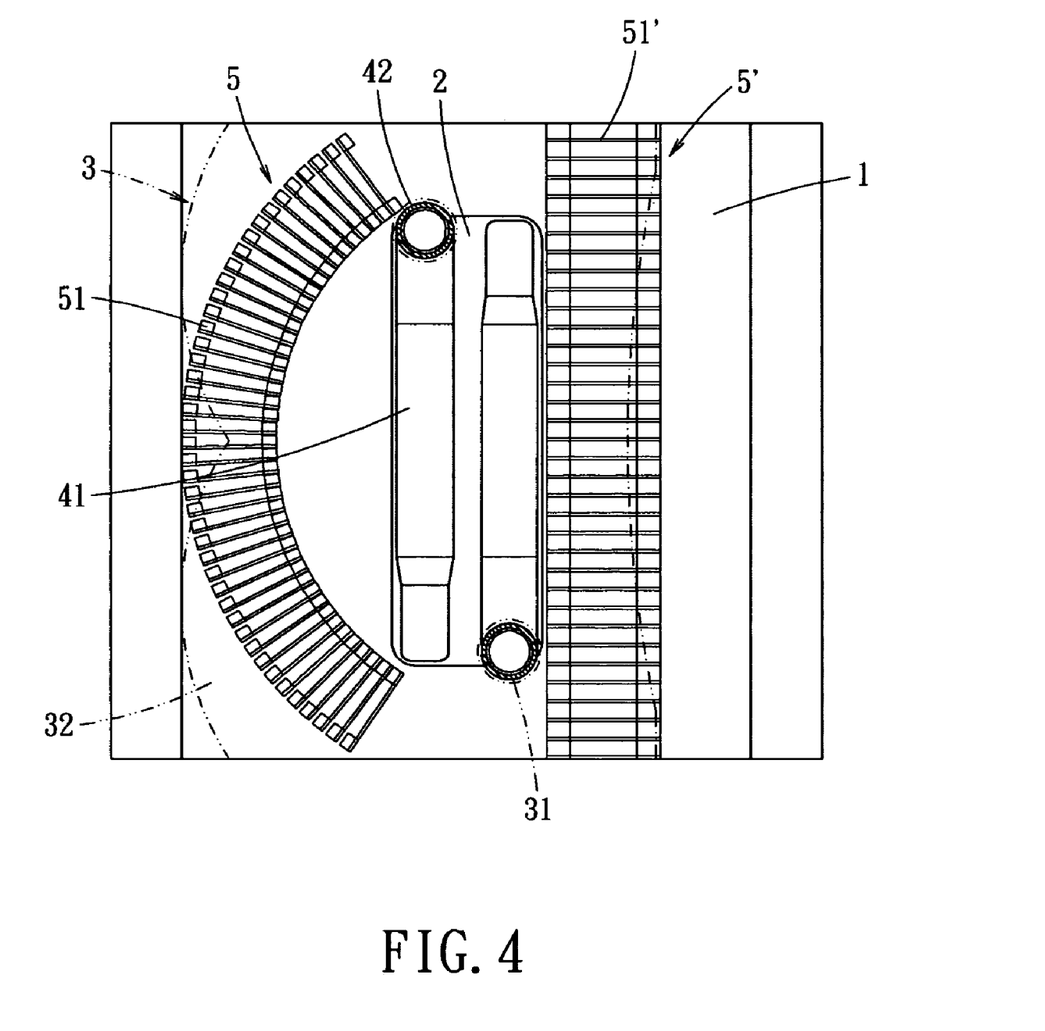
FIG. 4 shows a top view of the heat dissipating device as shown in FIG. 2.

The second set of fins 5 includes a plurality of vertically extending fins 51. As shown in FIG. 2, the fins 5 are stacked along a horizontal direction to form a curved integrated set of fins 5, which is preferably mounted to the top surface of the heat sink 1 as shown in FIG. 4. In one embodiment of the present invention, the heat dissipating device 10 may further include a third set of fins 5' that comprises a plurality of vertically extending fins 51' aligned with each other along a horizontal direction to form the strip-like integrated set of fins 5'. Similar to the second set of fins 5, the third set of fins 5' is mounted to the top surface of the heat sink 1. Preferably, the second and third set of fins 5 and 5' are arranged at two sides of the opening 11.

Figure 5:
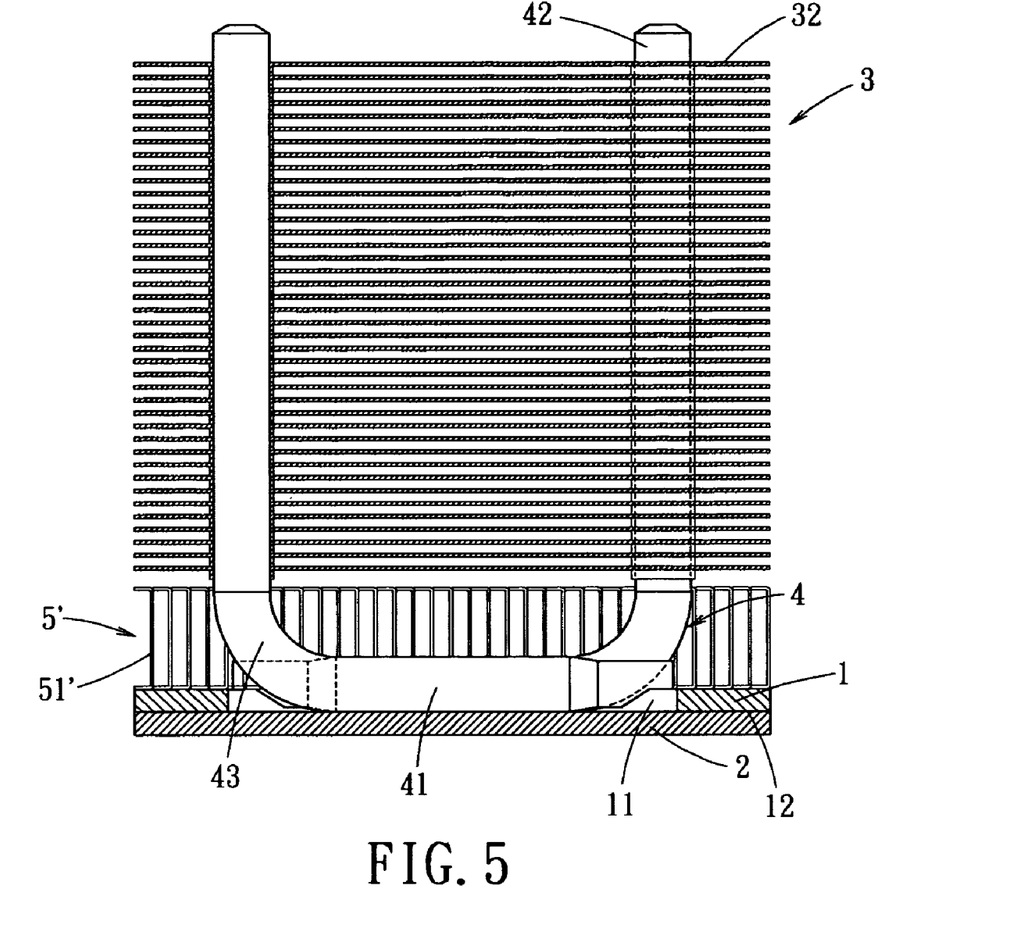
FIG. 5 shows a front view of the heat dissipating device as shown in FIG. 2.
Figure 6:
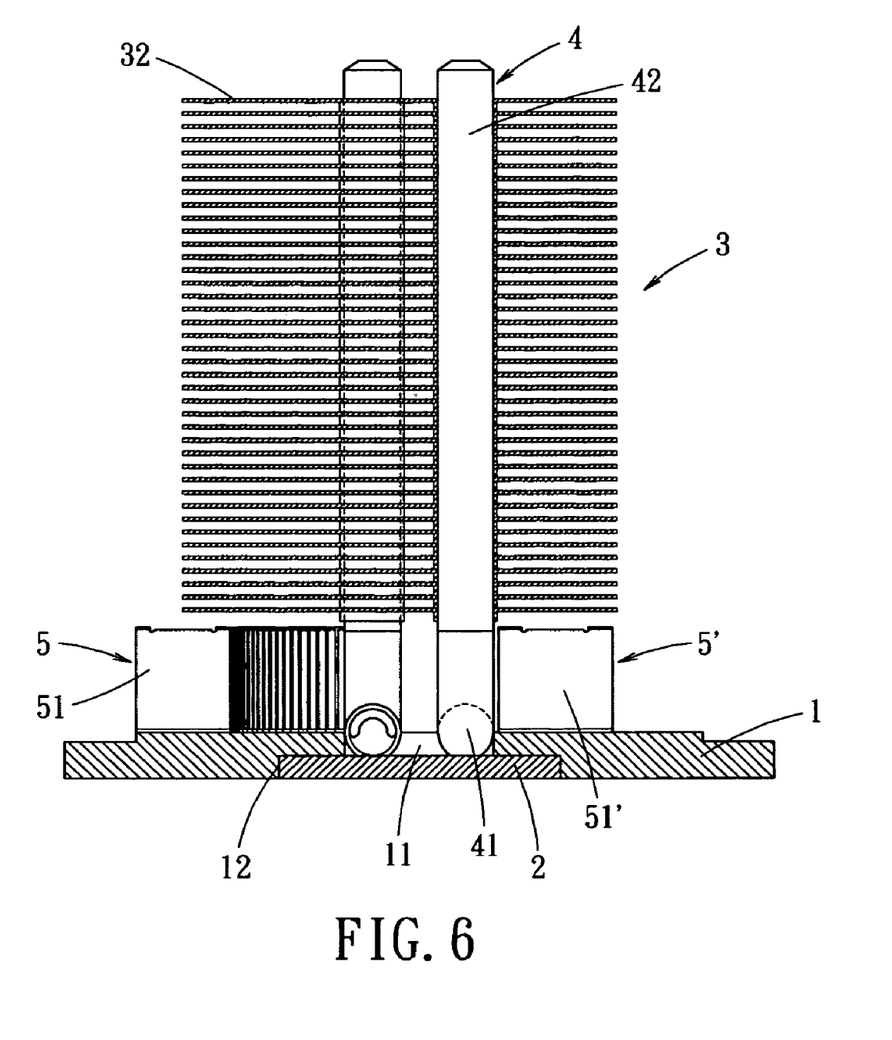
FIG. 6 shows a cross-sectional view of the heat dissipating device as shown in FIG. 2.

In this embodiment, the heat dissipating device 10 includes a pair of L-shape heat pipes 4. Each of the heat pipes 4 includes a horizontal extension serving as a heat absorption portion 41 and a vertical extension serving as a heat dissipating portion 42. As shown, the heat absorption portions 41 are disposed under the first set of fins 3, while the heat dissipating portions 42 extend across the first set of fins 3. To allow the heat dissipating portions 42 extending across the first set of fins 3, holes 31 are formed through each of the fins 32. As shown in FIGS. 2 and 4, the first set of fins 3 is mounted on the second and third sets of fins 5 and 5' with the heat absorption portions 42 of the heat pipes 4 aligned with the opening 11. Therefore, the heat absorption portions 42 of the heat pipes 4 are embedded in the heat sink 1 to obtain a direction contact with the thermal conductive block 2. Each heat pipe 4 further comprises a curved portion 43 interconnecting the heat absorbing portion 41 and the heat dissipating portion 42. The height of the curved portions 43 depends on the heights of the first and second set of fins 5 and 5', such that the heat absorption portions 41 can be embedded in the opening 11 and directly contact the thermal conductive block 2 as shown in FIGS. 5 and 6.

Figure 7:
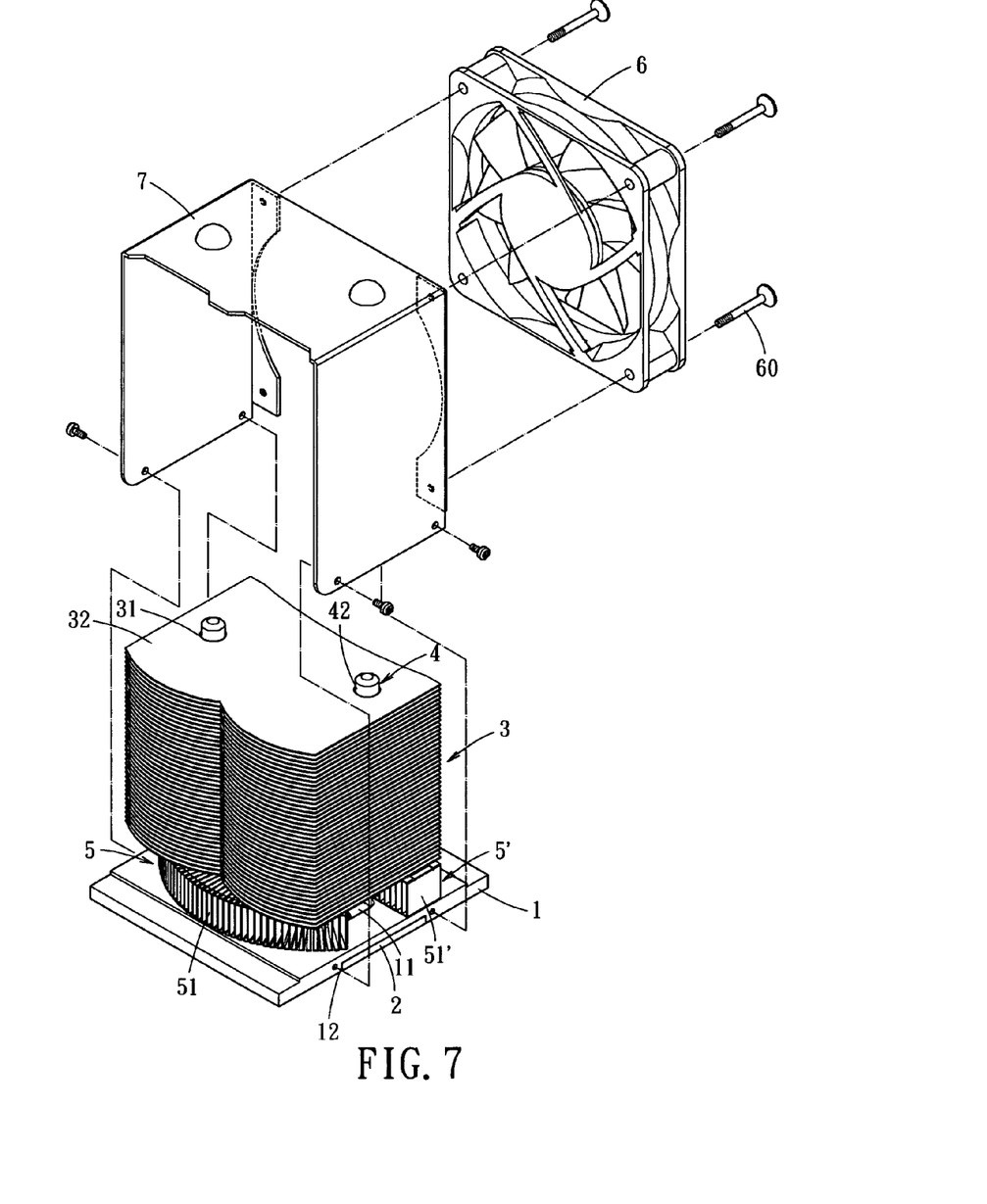
FIG. 7 shows an exploded view of an assembly of the heat dissipating device as shown in FIG. 2 and a fan.
Figure 8:
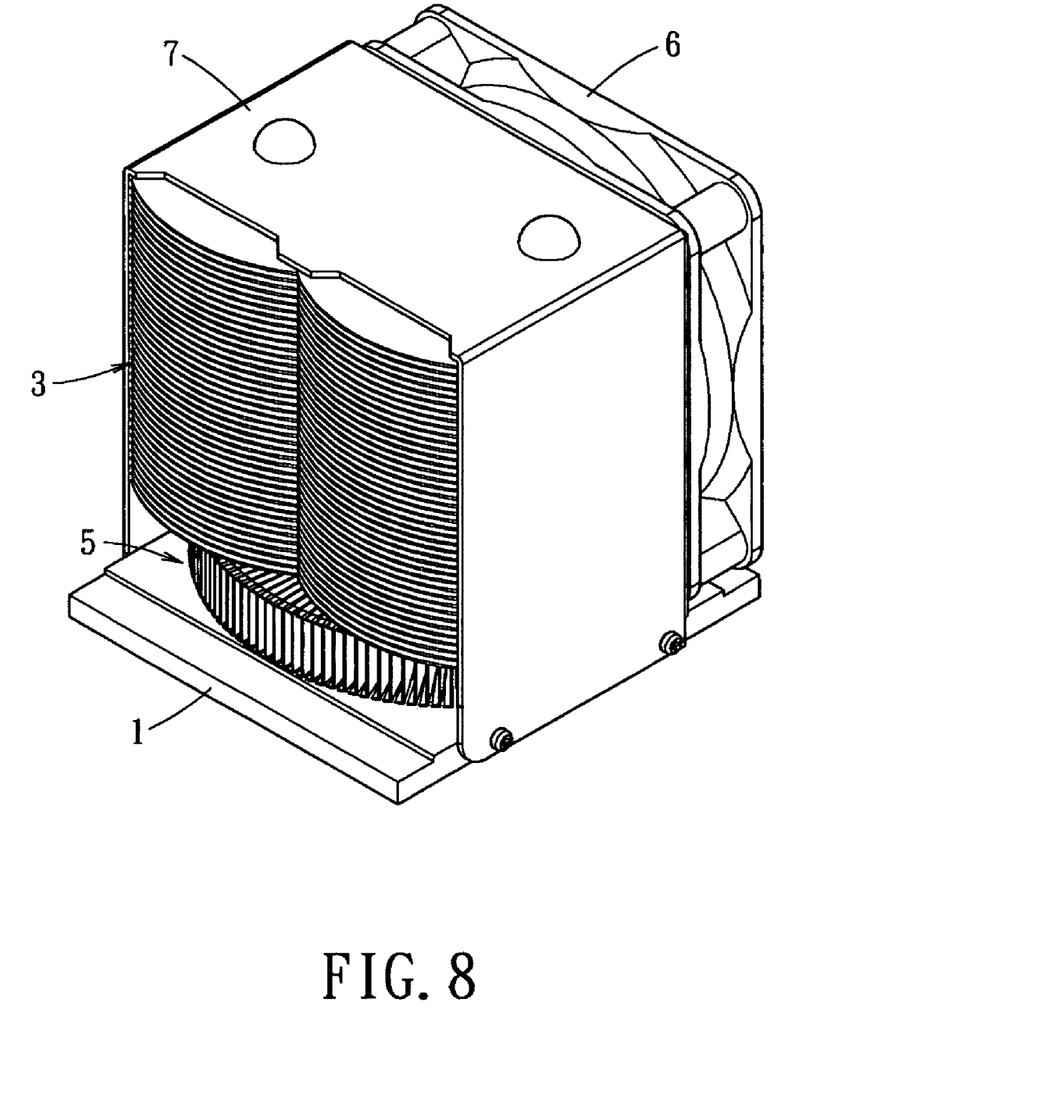
FIG. 8 shows a perspective view of the assembly as shown in FIG. 7.

As shown in FIGS. 7 and 8, the heat dissipating device 10 may further comprises a fan 6 and a wind mask 7 for mounting the fan 6 to a planar side surface of the first set of fins 3. The wind mask 7 includes a top surface and two opposing side surfaces extending perpendicularly from two opposing edges of the top surfaces. Therefore, by fitting the heat dissipating device 10 over the first, second and third sets of fins 3, 5 and 5', two opposing side surfaces of the first set of fins 3 are masked thereby. As shown, the masked side surfaces are perpendicular to the side surface on which the fan 6 is mounted. That is, the masked side surfaces are perpendicular to wind blowing direction of the fan 6, such that unwanted turbulence or circulation of the wind generated by the fan 6 is avoided. Further, as the wind blowing direction is parallel to the fins 32, such that heat accumulated in the first set of fins 3 can be quickly dissipated.

Figure 9:
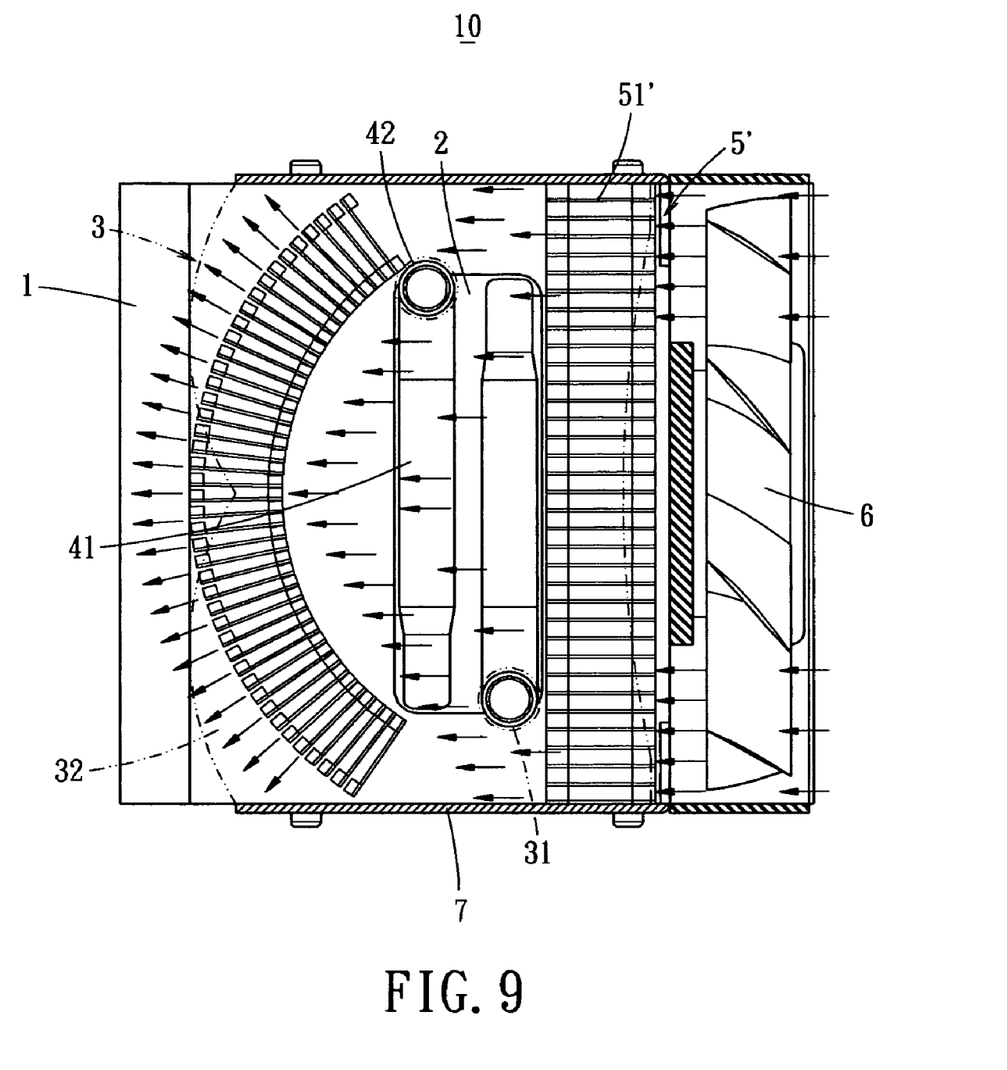
FIG. 9 shows a top view of the operation of the assembly as shown in FIG. 7.
Figure 10:
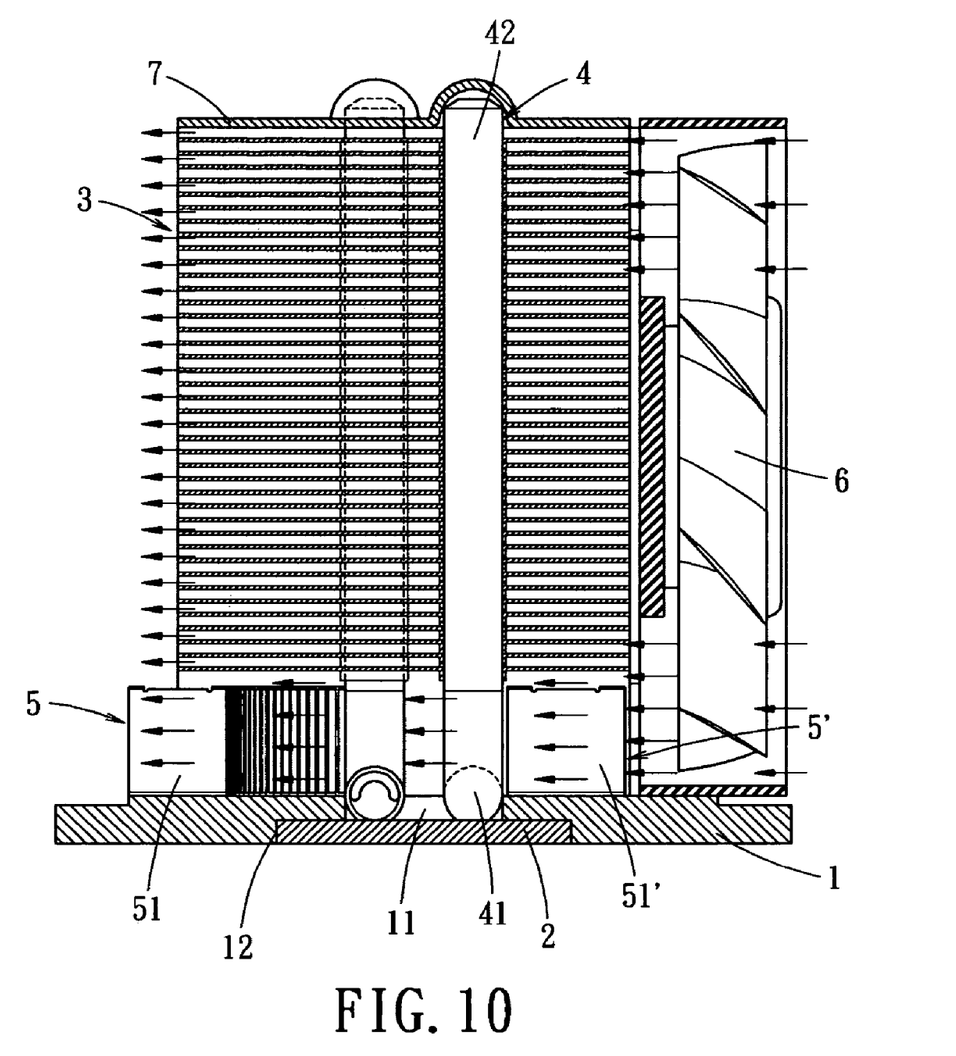
FIG. 10 shows a side view of the operation of the assembly as shown in FIG. 7.

Referring to the operation status as shown in FIGS. 9 and 10, the heat generated by the central processing unit is absorbed by the thermal conductive block 2, and the heat absorption portions 41 of the heat pipes 4 effectively absorb the heat and deliver it to the first set of fins 3 via the heat dissipating portions 42. In addition, the heat absorbed by the heat sink 1 is also absorbed by the second and third sets of fins 5 and 5'. With the aid of the fan 6, and the curved shape of the second set of fins 5, heat will be instantly dissipated.

According to the above, this disclosure provides exemplary embodiment of the present invention. The scope of this disclosure is not limited by these exemplary embodiment. Numerous variations, whether explicitly provided for by the specification or implied by the specification, such as variations in shape, structure, dimension, type of material or manufacturing process may be implemented by one of skill in the art in view of this disclosure.

What is claimed is:

1. An integrated heat dissipating device having curved fins, comprising:
    a heat sink, having a thermal conductive block embedded therein and a through hole exposing the thermal conductive block from a top surface of the heat sink;
    a first set of fins including a plurality of horizontally extending fins stacked with each other along a vertical direction over the heat sink;
    a second set of fins integrated by a plurality of vertically extending fins arranged in a curved shape between the heat sink and the first set of fins; and
    at least one heat pipe comprising a vertical extension across the first set of fins and a horizontal extension underneath a bottom of the first set of fins, the horizontal extension being inserted into the through hole in contact with the thermal conductive block.

2. The device of claim 1, wherein the heat sink includes a planar structure with a bottom surface partially recessed for forming a receiving slot aligned with the through hole for embedding the thermal conductive block.

3. The device of claim 1, wherein the thermal conductive block has a thermal conducting coefficient larger than that of the heat sink.

4. The device of claim 1, further comprising a third set of fins mounted between the heat sink and the first set of horizontally extending fins, wherein the second and third sets of fins are disposed at two opposing sides of the through hole.

5. The device of claim 1, wherein the heat pipe has an L shape.

6. The device of claim 1, wherein the heat pipe further comprises a bending portion interconnecting the vertical extension and the horizontal extension.

7. The device of claim 1, further comprising a fan mounted to a first side surface of the heat dissipating device.

8. The device of claim 7, further comprising a wind mask fitting over the first, second and third sets of fins for mounting the fan to the first side surface.

9. The device of claim 8, wherein the wind mask covers a top surface and two opposing surfaces perpendicular to the first side surface of the heat dissipating device.

10. A heat dissipating device, comprising:
   a heat sink, having a thermal conductive block embedded therein and a through hole exposing the thermal conductive block from a top surface of the heat sink;
   a first set of fins stacked with each other along a vertical direction over the heat sink;
   a second set of fins integrated by a plurality of vertically extending fins disposed between the heat sink and the first set of fins at a first side of the through hole;
   a third set of fins integrated by a plurality of vertically extending fins disposed between the heat sink and the first set of fins at a second side of the through hole, wherein the second side is opposite to the first side; and
   at least one heat pipe comprising a vertical extension across the first set of fins and a horizontal extension underneath a bottom of the first set of fins, the horizontal extension being inserted into the through hole in contact with the thermal conductive block.

11. The device according to claim 10, further comprising a fan operative to generate wind along a direction parallel to each fin of the first set of fins.

12. The device of claim 10, wherein the heat sink includes a planar structure with a bottom surface partially recessed for forming a receiving slot aligned with the through hole for embedding the thermal conductive block.

13. The device according to claim 11, further comprising a wind mask covering two side surfaces of the heat dissipating device parallel to the wind direction.

14. The device according to claim 10, wherein the second set of fins is curved.

15. The device of claim 10, wherein the thermal conductive block has a thermal conducting coefficient larger than that of the heat sink.

16. The device of claim 10, wherein the heat pipe has an L shape.

* * * * *